United States Patent [19]

Hamada et al.

[11] 4,310,616

[45] Jan. 12, 1982

[54] METHOD AND APPARATUS FOR DEVELOPING AND TREATING PS PLATES

[75] Inventors: Shinji Hamada; Kiichiro Sakamoto, both of Minami-ashigara, Japan

[73] Assignee: Fuji Photo Film Co., Ltd., Minami-ashigara, Japan

[21] Appl. No.: 140,542

[22] Filed: Apr. 15, 1980

[30] Foreign Application Priority Data

Apr. 19, 1977 [JP] Japan .................................. 54-48154

[51] Int. Cl.³ ............................................. G03F 7/02
[52] U.S. Cl. ................... 430/309; 430/302; 430/306; 430/421
[58] Field of Search ................. 430/30, 302, 306, 309, 430/325, 434, 436, 427, 428, 421; 354/297, 316, 317, 318, 325, 324

[56] References Cited

U.S. PATENT DOCUMENTS

| | | | |
|---|---|---|---|
| 3,448,720 | 6/1969 | Graham | 354/325 X |
| 3,846,816 | 11/1974 | Gaisser | 354/317 X |
| 3,851,662 | 12/1974 | Jessop | 354/324 X |
| 4,081,816 | 3/1978 | Geyken et al. | 354/297 X |
| 4,215,927 | 8/1980 | Grant et al. | 354/325 X |

*Primary Examiner*—Mary F. Downey
*Attorney, Agent, or Firm*—Sughrue, Mion, Zinn, Macpeak & Seas

[57] ABSTRACT

Method and apparatus for developing and treating PS plates in which the useful life of the treatment liquid is greatly enhanced. First and second developing baths and a gum coating bath are provided with the PS plates conveyed therethrough. The plates are squeezed between the first and second developing baths to remove treatment liquid. Treatment liquid is transferred from the second to the first developing bath and discharged from the first developing bath when the liquid in the first bath is beyond the normal limit of treatment ability for a single bath system. New treatment liquid is supplied to the second bath in proportion to the amount of treatment and the lapse of time.

5 Claims, 1 Drawing Figure

METHOD AND APPARATUS FOR DEVELOPING AND TREATING PS PLATES

BACKGROUND OF THE INVENTION

The present invention relates to a method of developing and treating a PS plate and an apparatus for practicing the method.

A PS plate on which the image of an original has been printed is ordinarily developed and treated by applying a development treatment liquid (hereinafter referred to merely as "a treatment liquid") and then rubbing the plate with brushes or a sponge while conveying the plate through a developing bath. Since no photosetting occurs in the non-image portions of the PS plate, that is, regions in which no image of the original has been printed, the non-image portions are changed into a swelling film by the treatment liquid containing organic solvents or alkali aqueous solutions in the aforementioned development treatment. The swelling film or the non-image portions, can be readily removed by a rubbing device such as a brush or sponge as a result of which only the image portion remains on the PS plate. As a result, dissolved materials such as photosensitive materials from the PS plate are mixed into the treatment liquid. Furthermore, as the treatment liquid is in general applied in a shower system to the PS plate passing through the developing bath, the plate tends to deteriorate because of its contact with air. For instance, its pH tends to be lowered by the presence of carbon dioxide gas dissolved therein.

Because of this phenomenon, the developing ability of the treatment liquid generally decreases in proportion to the amount of treatment of the PS plate and the lapse of time. When the developing ability of the treatment liquid has decreased to its minimum acceptable limits, then it is necessary to replace the treatment liquid. If a PS plate is treated with treatment liquid of which the developing ability has been decreased beyond its acceptable limits, then the photosensitive film in the non-image portion tends to remain on the surface of the PS plate thereby making the resultant prints unclear or dirty and making it difficult to reproduce the image of the original satisfactorily, for instance, with a satisfactory tone.

Heretofore, the treatment of a PS plate in general included a developing process, a washing process, a gum coating process and a drying process. However, recently a washing-less treatment system in which the washing process is eliminated and the PS plates delivered from the developing process directly to the gum coating process has been employed to eliminate a public hazard due to the waste water discharged during the washing process. However, the washing-less treatment system is still disadvantageous in the following points. Even if treatment liquid whose treatment ability is near the lower limit yet within the acceptable range is used to treat the PS plate, the background of the PS plate may still be made dirty and the inking may be unsatisfactory. In addition, the treatment liquid into which the photosensitive material has been dissolved, namely the deteriorated treatment liquid, tends to stick onto the surface of the PS plate, and mix with the gum liquid again making the background of the PS plate dirty and causing unsatisfactory inking.

Accordingly, in the washing-less treatment system it is essential to suitably design a pair of rollers provided at the output side of the developing process section to squeeze off the treatment liquid on the PS plate to avoid as much as possible introduction of the treatment liquid into the gum coating process. It is impossible to completely eliminate the introduction of the treatment liquid into the gum coating process. This problem may however be solved by replacing the treatment liquid before the amount of photosensitive material dissolved in the treatment liquid reaches a high level. However, this solution is not economical.

An object of the present invention therefore is to provide a method for developing and treating a PS plate in which the development treatment is accomplished under the condition that the amount of photosensitive material dissolved in the treatment liquid is reduced but in which the treatment liquid can be used economically and to provide an apparatus for practicing the method.

SUMMARY OF THE INVENTION

The foregoing object and other objects of the invention have been achieved by the provision of a method of developing and treating a PS plate in which, according to the invention, a developing and treating bath utilized therein includes a first developing bath and a second developing bath. The treatment of the PS plate is effected by passing the PS plate successively through the first and second developing baths. Preferably, the treatment liquid used for the second developing bath is used again as the treatment liquid for the first developing bath.

In the development treatment of a PS plate, the non-image portion of the PS plate which is not optically set is removed by a rubbing device such as a brush or sponge while it is being swelled with the treatment liquid containing organic solvent of alkali solution with the swelled film readily dissolved into the treatment liquid. With the PS plate passes successively through the first and second developing baths forming the developing and treating bath, a larger part of the swelled film removed from the PS plate is dissolved into the treatment liquid in the first developing bath. Only the swelled film which could not be removed in the development treatment in the first developing bath is dissolved into the second developing bath. Therefore, the amount of dissolved material such as photosensitive material in the treatment liquid in the second developing bath is quite small. In addition, even if the treatment liquid in the first developing bath is considerably fatigued or if, for instance, the PS plate has been treated with treatment liquid which is beyond the treatment ability limits for a conventional development treatment system in which a single developing bath is employed, the amount of dissolved material such as photosensitive material on the PS plate passing through the second developing bath is much less than the amount of dissolved material which would be present with treatment liquid whose treatment ability is still within its acceptable range in a single bath system. Furthermore, if the period of time for treatment in the first developing bath is made longer than that for the second developing bath, then advantageously the PS plate can be properly treated even if the treatment liquid in the first developing bath becomes further fatigued.

Further, in accordance with the invention, when the treatment ability of the treatment liquids in the first and second developing baths drop, the treatment liquid in the first developing bath is discharged and the treatment liquid in the second developing bath is transferred into the first developing bath and new treatment liquid is supplied to the second developing bath. In this manner, the treatment liquid is used very economically. Furthermore, in accordance with another aspect of the invention, new treatment liquid is supplementarily supplied into the second developing bath according to the amount of treatment of the PS plate in such a manner that a part of the treatment liquid in the second developing bath is transferred into the first developing bath and a part of the treatment liquid in the first developing bath is discharged. A PS plate can then be treated while the treatment liquid in the second developing bath is being utilized again as the treatment liquid for the first developing bath. If, in this case, the amount of treatment liquid supplementarily supplied is selected by referring to the limit of ability of the treatment liquid in the two developing baths as well as the reduction in treatment ability of the treatment liquid with the lapse of time, then the treatment can be most economically utilized.

It is unnecessary to use a force-applying liquid delivering device such as a pump in order to transfer a part of the treatment liquid in the second developing bath to the first developing bath or to discharge the treatment liquid from the first developing bath. Instead, an overflow system can be employed in which excessive amounts of treatment liquid are transferred from the second developing bath to the first developing bath and from the first developing bath into a waste liquid tray by supplementarily supplying new treatment liquid into the second developing bath.

DESCRIPTION OF THE PREFERRED EMBODIMENTS

Figure 1:
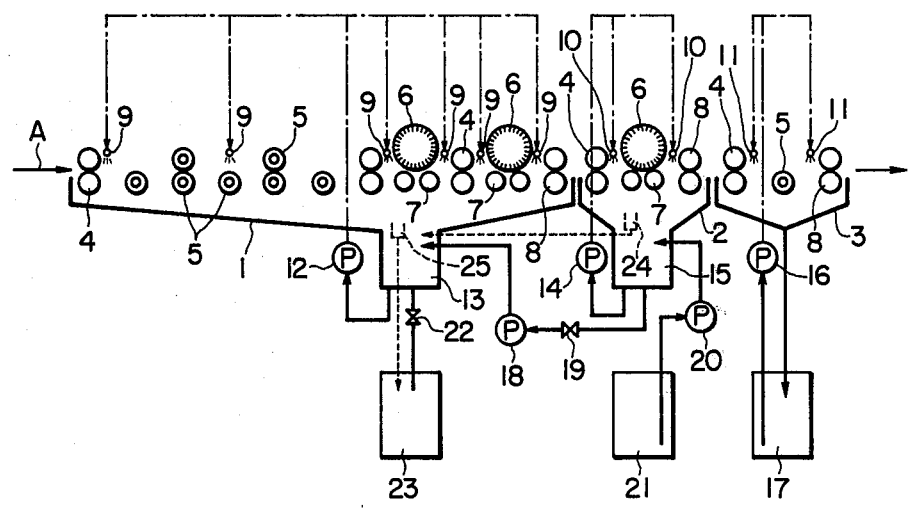
FIG. 1 is a diagrammatic side view showing essential components of an apparatus for practicing the invention.

The invention will be described with reference to its preferred embodiments.

Apparatus

FIG. 1 is a side view of a developing apparatus for practicing this invention. The apparatus includes a development treatment section having a first developing bath 1 and a second developing bath 2. It further includes a gum treatment section directly coupled to the second developing bath 2 including a gum coating bath 3. The gum coating bath 3 is provided to form a plate surface protecting layer for protecting the non-image portion of the PS plate immediately after the plate has been developed but before it is washed. The first developing bath 1 includes conveying rollers 4, tandem rollers 5, brush rollers 6, receiving rollers 7, squeezing rollers 8, and shower pipes 9 for applying the treatment liquid in a shower system to PS plates conveyed in the direction of the arrow A. The second developing bath 2 includes conveying rollers 4, a brush roller 6, squeezing rollers 8, and shower pipe for applying the treatment liquid in a shower system to PS plates received from the first developing bath 1. The gum coating bath 3 includes conveying rollers 4, a tandem roller 5, and shower pipes 11 for applying the gum liquid in a shower system to PS plates delivered from the second developing bath 2.

A pump 12 supplies in a circulating manner treatment liquid from a liquid pool 13 in the first developing bath 1 to the shower pipes 9. A pump 14 supplies in a circulating manner treatment liquid from a liquid pool 15 in the second developing bath 2 to the shower pipes 10. A pump 16 supplies in a circulating manner gum liquid from a gum liquid tank 17 to the shower pipes 11. A pump 18 is provided to shift the treatment liquid in the second developing bath 2 to the liquid pool 13 of the first developing bath 1 when a valve 19 is opened. A pump 20 is provided to pump the treatment liquid from a new liquid storing tank 21 to the liquid pool 15 of the second developing bath 2. A valve 22 is opened when it is desired to discharge the treatment liquid from the first developing bath 1 into a waste liquid recovering tank 23.

PS Plate

The PS plate is prepared as follow. The surface of an aluminum support having an anodic oxidation film is provided with an undercoating layer compound of carlboxylmethylcellulose and nickel acetate. This undercoating layer is then coated with a photosensitive layer which is formed by sensitizing with 3-methyl-2-benzoylmethylene-$\beta$-naphthorhiazolen a photosensitive polymer which is prepared by the condensation polymerization of diethyl-p-phenylendiacrylate and 1,4-di-$\beta$-hydroxy ethoxycyclohexane.

Treatment Liquid

A treatment liquid includes the following materials in the stated amounts:

| | |
|---|---|
| $\gamma$ butyrolactone | 8130 g |
| Glycerol | 813 g |
| Water | 400 g |
| Polyethylene glycol | 400 g |
| Paratoluenesulfonic acid | 163 g |
| Noigen ET #120 (Trade name: a surface activator made by Daiichi Kogyo Yakuhin) | 82 g |

Gum Liquid

The gum liquid preferably includes the following materials in the specified amounts:

| | |
|---|---|
| Gum arabic (14° Baume degree) | 6000 g |
| Water | 3000 g |
| Polyethylene glycol #4000 | 500 g |
| Phosphoric acid | 200 g |
| Benzyl alcohol | 100 g |
| Noigen ET #120 (Trade name: a surface activator made by Daiichi Kogyo Yakuhin) | 30 g |
| Sodium borate | 200 g |

The treatment liquid can be delivered to the first developing bath 1 and the second developing bath 2 of the washing-less type PS plate treating apparatus constructed as described above according to the following procedure. While treatment liquid having the above-described composition is being supplied from the new liquid storing tank 21 to the second developing tank 2 by operation of the pump 20, the valve 19 is opened and the pump 18 is operated. When a suitable amount of treatment liquid has been supplied to the first developing bath 1, the pump 18 is stopped and the valve 19 is closed. Then, when a suitable amount of treatment liquid has been transferred to the second developing bath 2, the pump 20 is stopped.

The gum liquid is put in the gum liquid tank 17. Thereafter, the pumps 12, 14 and 16 are operated to supply the treatment liquid and the gum liquid in a circulating manner. The PS plates can then be conveyed for treatment in the direction of the arrow A. As a result, the PS plates are subjected to development treatment in the first developing bath 1 and the second developing bath 2 with plate surface protecting layers formed on the PS plates by the gum coating bath 3. PS plates thus treated are discharged from the gum coating bath 3.

When, during the development treatment in the first developing bath 1 and the second developing bath 2 the performance of the treatment liquid is decreased to its lower limit, the pumps 12 and 14 are stopped and the valve 22 is opened so as to discharge the treatment liquid in the first developing bath 1 into the waste liquid recovering tank 23 after which the valve 22 is closed. Thereafter, the valve 19 is opened and the pump 18 is operated so that the treatment liquid in the second developing bath 2 is transferred to the first developing bath 1. Then, the valve 19 is closed and the pump 18 is stopped. New treatment liquid is supplied from the new liquid storing tank 21 to the second developing bath 2 by operation of the pump 20. When a suitable amount of treatment liquid has been supplied into the second developing bath 2, the pump 20 is stopped. Thereafter, in the same manner, treatment liquid is discharged from the first developing bath 1, treatment liquid in the second developing bath 2 is transferred to the first developing bath 1, and new treatment liquid is supplied to the second developing bath 2.

In the above-described embodiment, the treatment liquid is all replaced at once. However, the following overflow system may be employed for replacing the treatment liquid. New treatment liquid is supplementarily supplied in proportion to the amount of treatment of PS plates and to the lapse of time by operating the pump 20 when required so that excessive amounts of treatment liquid in the second developing bath 2 are transferred through an overflow nozzle 24 to the first developing bath 1 and excessive amounts of treatment liquid in the first developing bath 1 are discharged through an overflow nozzle 25 to the waste liquid recovering tank 23. In this case, it is necessary to set the amount of supplement of new treatment liquid so that the performance of the treatment liquid in the first and second developing baths 1 and 2 remains within its effective limits for the development treatment of the PS plate.

As the treatment liquid which is carried by the PS plate from the developing section to the gum coating bath 3 increases, the gum liquid supplied to the gum coating bath 3 may from solid particles with substances which is dissolved in the treatment liquid which come from the PS plate. Therefore, in this case, the gum liquid should be completely replaced.

As is clear from the above description, with the application of the present invention to a washing-less type PS plate treatment, the treatment performance of the treatment liquid and the service life or treatment ability of the gum liquid are increased respectively by factors 2 and 1.5 times of those of the conventional case where only a single developing bath is provided.

The preferred method of treating a developed PS plate and the apparatus for practicing the method according to the invention have been described above. Therefore, the treatment liquid can be used economically. Most advantageously, in the present case where a washing-less treatment system is employed, PS plates are brought to the gum treatment process under the condition that the photosensitive material contained in the treatment liquid adhering to the PS plates delivered from the development treatment process section is minimized. Accordingly, the gum liquid is also used more economically than in the conventional case and the quality of the treated PS plate is remarkably improved.

What is claimed is:

1. A method for developing and treating PS plates comprising the steps of: providing a first developing bath and a second developing bath, passing PS plates successively through said first and second developing baths, said transfering treatment liquid used in said second developing bath to said first developing bath.

2. The method as claimed in claim 1 wherein the period of time for treatment in said first developing bath is longer than that for said second developing bath.

3. The method as claimed in claim 1 wherein said treatment liquid transferred to said first developing bath from said second treatment bath is beyond the limit of treatment ability which is required for developing and treating a PS plate in a single bath system, said method further comprising the step of supplying unused treatment liquid to said second development bath.

4. The method as claimed in claim 1 further comprising the steps of discharging said treatment liquid into said first developing bath when treatment liquid in said first and second developing baths is near the limit of treatment ability for treating said PS plates, transferring said treatment liquid in said second developing bath into said first developing bath, and supplying new treatment liquid to said second developing bath.

5. The method as claimed in claim 1 further comprising the steps of supplementarily supplying to said second developing bath unused treatment fluid in an amount proportional to an amount of treatment fluid carried by said PS plates and transferring a predetermined portion of said treatment liquid in said second developing bath to said first developing bath and a predetermined portion of said treatment liquid in said first developing bath is discharged.

* * * * *